(12) United States Patent
Gallardo

(10) Patent No.: US 6,731,146 B1
(45) Date of Patent: May 4, 2004

(54) METHOD AND APPARATUS FOR REDUCING PLL LOCK TIME

(75) Inventor: Keith Gallardo, La Mesa, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/567,802

(22) Filed: May 9, 2000

(51) Int. Cl.[7] ................................................. H03L 7/06
(52) U.S. Cl. ........................................ 327/158; 327/147
(58) Field of Search ............................... 327/147, 149, 327/156, 158, 145, 105, 45

(56) References Cited

U.S. PATENT DOCUMENTS

| | | | |
|---|---|---|---|
| 4,743,864 A | | 5/1988 | Nakagawa et al. |
| 5,235,422 A | * | 8/1993 | Ido et al. ............... 348/537 |
| 5,528,307 A | * | 6/1996 | Owada et al. ............ 348/497 |
| 6,114,888 A | * | 9/2000 | Walley .................. 327/157 |
| 6,150,891 A | * | 11/2000 | Welland et al. ........... 331/25 |
| 6,223,061 B1 | * | 4/2001 | Dacus et al. ............. 455/574 |

FOREIGN PATENT DOCUMENTS

| | | |
|---|---|---|
| DE | 677298 A5 | 4/1991 |
| EP | 56136037 | 10/1981 |
| EP | 0051774 | 5/1982 |
| JP | 56136037 | 10/1981 |

* cited by examiner

*Primary Examiner*—Timothy P. Callahan
*Assistant Examiner*—Cassandra Cox
(74) *Attorney, Agent, or Firm*—Philip Wadsworth; Charles Brown; Donald Korwich

(57) ABSTRACT

The lock time is reduced in a phase locked loop frequency synthesizer that has both active modes and standby modes. In the active mode the frequency synthesizer operates to maintain a stable frequency output. The standby or sleep mode is used to reduce power consumption when the frequency synthesizer is not required to provide a frequency output. When the synthesizer is placed in standby mode the most recent value of the Voltage Controlled Oscillator (VCO) tuning voltage is maintained on the VCO tuning control line of the frequency synthesizer. The voltage is maintained on the VCO tuning output pin in Integrated Circuit (IC) frequency synthesizers. The voltage error on the VCO tuning pin is minimized thereby minimizing the lock time of the frequency synthesizer.

5 Claims, 4 Drawing Sheets

METHOD AND APPARATUS FOR REDUCING PLL LOCK TIME

BACKGROUND OF THE INVENTION

I. Field of the Invention

The present invention relates to Phase Locked Loops (PLL's). More particularly, the present invention relates to a novel and improved method and apparatus for reducing the time required to obtain phase lock in a PLL that is activated following operation in standby mode.

II. Description of the Related Art

Accurate frequency sources are vital to the operation of numerous electronic systems and devices. Frequency sources are used as timing sources within electronic devices and are also used to tune electronic devices to desired communication channels.

Many types of accurate frequency sources are available. The specific type of frequency source implemented within a particular application is determined according to the design constraints of the particular application. Atomic clocks exhibit extreme levels of frequency accuracy, however, their size, cost, and absence of tuning range greatly limit their actual application within an electronic system. Similarly, accurate frequency sources can be designed utilizing the piezoelectric effect of quartz crystals. The small size and relative accuracy of quartz crystal based frequency sources make them popular for most consumer based electronic devices. However, a frequency source based upon the fundamental frequency of a quartz crystal is limited by the minimal frequency tuning range and limitations on the fundamental frequency of a quartz crystal.

Indirect frequency synthesis is used to overcome the problems of the lack of frequency tuning and limited center frequency associated with fundamental quartz crystal frequency sources. Indirect frequency synthesis utilizes a Phase Locked Loop (PLL) to generate a frequency source that is a multiple of a reference frequency. Specific implementations of indirect frequency synthesis often use a quartz crystal oscillator as the reference frequency.

A frequency source implemented using indirect frequency synthesis is commonly known as a frequency synthesizer. A common implementation of a frequency synthesizer is shown in FIG. 1. A quartz crystal 20 is coupled to an oscillator 30 to generate a reference frequency. A reference divider 32 is coupled to the output of the oscillator 30 to scale the reference frequency. A Voltage Controlled Oscillator (VCO) 60 operates to provide the desired output of the frequency synthesizer 10. The output of the VCO 60 is also coupled to an output frequency divider 62 that generates a scaled output of the VCO 60. The output of the reference divider 32 is coupled to a first input of a phase detector 40. The output of the output frequency divider 62 is coupled to a second input of the phase detector 40. The phase detector 40 compares the scaled output from the output frequency divider 62 to the scaled output from the reference divider 32. The phase detector 40 output is a control signal based upon the comparison of the input signals. The phase detector 40 output is coupled to a loop filter 50 that limits the frequency component of the phase detector 40 output. The output of the loop filter 50 is coupled to a control input on the VCO 60. The signal on the control input of the VCO 60 operates to tune the VCO 60 output frequency. The frequency synthesizer 10 is thus a phase locked loop wherein the loop operates to maintain phase lock between the scaled reference frequency and the scaled output frequency. The common architecture of a frequency synthesizer 10 allows for a number of the functional blocks to be combined within a single Integrated Circuit (IC). A typical frequency synthesizer IC integrates the oscillator 30, reference divider 32, output frequency divider 62, and phase detector 40. The user is only required to provide the additional elements consisting of a crystal 20 for the oscillator 30, a VCO 60, and a loop filter 50 to complete the frequency synthesizer 10.

The operation of a Phase Locked Loop (PLL) is characterized by a number of parameters. These characteristics include the pull in time and pull in range. The pull in range is defined as the range of frequencies over which the PLL will acquire and lock the VCO output to the reference frequency. The pull in time represents the time required for the pull in process. Both the pull in range and pull in time are affected by the type of phase detector used in the PLL as well as the order of the loop filter.

The time the PLL takes to acquire and lock a VCO output signal is important in many applications. PLL lock time design constraints are determined by the specific application. Frequency synthesizers utilizing PLL's are used within portable communication devices to generate Local Oscillator (LO) signals. LO signals are used to tune receivers and transmitters to specific channels. Typically, in a receiver the LO is used to downconvert the received RF signal to a baseband signal. Conversely, in a transmitter a LO is used to upconvert baseband signals to designated RF channels. Frequency synthesizers used for the generation of LO signals are found in devices such as two-way radios, stereo receivers, televisions, and wireless phones. However, one of ordinary skill in the art will recognize that frequency synthesizers are not limited to the generation of LO signals. Frequency synthesizers are capable of satisfying the requirements of the majority of frequency source applications.

Frequency synthesizer power consumption is an important design concern when the frequency synthesizer is used in a portable electronic device. The battery life on a portable electronic device decreases in proportion to increases in power consumption. Therefore, minimization of power consumption is highly desirable in electronic circuits used in portable electronic devices.

Portions of a wireless phone may be powered down under certain conditions in order to conserve battery power and extend battery life. In a wireless phone operating in a Code Division Multiple Access (CDMA) communication system, such as the one described in Telecommunications Industry Association (TIA)/Electronics Industries Association (EIA) 95-B MOBILE STATION-BASE STATION COMPATIBIY STANDARD FOR DUAL-MODE SPREAD SPECTRUM SYSTEMS, the phone may power down specific circuits under a variety of conditions. The system described by TIA/EIA 95-B allows the phone to operate at a reduced data rate during a phone call under certain conditions. When the phone is operating in the reduced data rate mode the phone's transmitter transmits bursts of data packets. To conserve power, portions of the phone's transmit chain are powered down during the time period in which the phone is not required to transmit any data.

Additional power savings are achieved by powering down portions of the phone during the time the phone is in the idle state where a call is not in progress. A CDMA phone operating in a TIA/EIA 95-B system performs a number of tasks while in the idle state. These tasks include performing registration procedures and idle handoff procedures. Additional tasks include receiving overhead messages, configuration messages, page messages, mobile station directed orders, data burst messages and acknowledgements for access channel messages. The phone is not continually active in the idle state. To take advantage of the limited phone activity in the idle state, portions of the phone can be powered down during periods within the idle state to further reduce power consumption and increase battery life. The phone can be placed in a standby or sleep mode during the idle state when no phone activity is required. Only critical portions of the phone remain powered up during sleep mode. All remaining noncritical portions of the phone are powered down to minimize phone power consumption. The frequency synthesizer used to generate the LO signals is one of the non-critical circuits powered down during the sleep mode.

However, the phone is periodically required to wake up and service the required idle state tasks. When the phone wakes up it is required to synchronize its timing with the system before it can transmit or receive communications. The time the phone uses to resynchronize with the system must be minimized in order to maximize the power savings gained by placing the phone in the sleep mode. The time required by the frequency synthesizer to tune and lock to the assigned frequency represent part of the phone synchronization time. Therefore, it is advantageous to minimize the time the frequency synthesizer uses to tune and lock to the desired frequency.

Standard methods of reducing the lock time of a PLL include increasing the VCO gain, increasing the bandwidth of the loop filter, and decreasing the damping factor of the loop filter. However, these lock time reduction methods are not available to the designer interested in reducing the PLL lock time for a frequency synthesizer that is switched from a sleep state to an idle mode in a wireless phone. This is because the performance of the frequency synthesizer in the locked state determines the majority of the parameters of the PLL. The values of VCO gain, loop filter bandwidth, and loop filter damping factor are limited by the design constraints imposed on the locked output of the frequency synthesizer. What is needed is a manner of improving the frequency synthesizer PLL lock time without degrading the performance of the frequency synthesizer output when the loop is locked.

SUMMARY OF THE INVENTION

The present invention is a novel and improved method and apparatus for decreasing the time required for a frequency synthesizer to lock after waking up from a sleep or standby mode. When the frequency synthesizer is placed in the sleep or standby mode the voltage on the VCO tuning line is maintained. The portions of the frequency synthesizer required to maintain phase lock are powered down during sleep mode to conserve power. The powered down circuits include the reference divider, phase detector, and output frequency divider. The voltage on the VCO tuning line is maintained at the voltage value that was on the VCO tuning line just prior to the frequency synthesizer being placed in the sleep mode.

In a frequency synthesizer Integrated Circuit (IC) the voltage at the VCO tune pin is maintained when the IC is placed in sleep mode. The IC samples the voltage value of the VCO control line just prior placing the IC in the sleep mode. The sampled value is maintained at the VCO tune pin of the frequency synthesizer IC.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
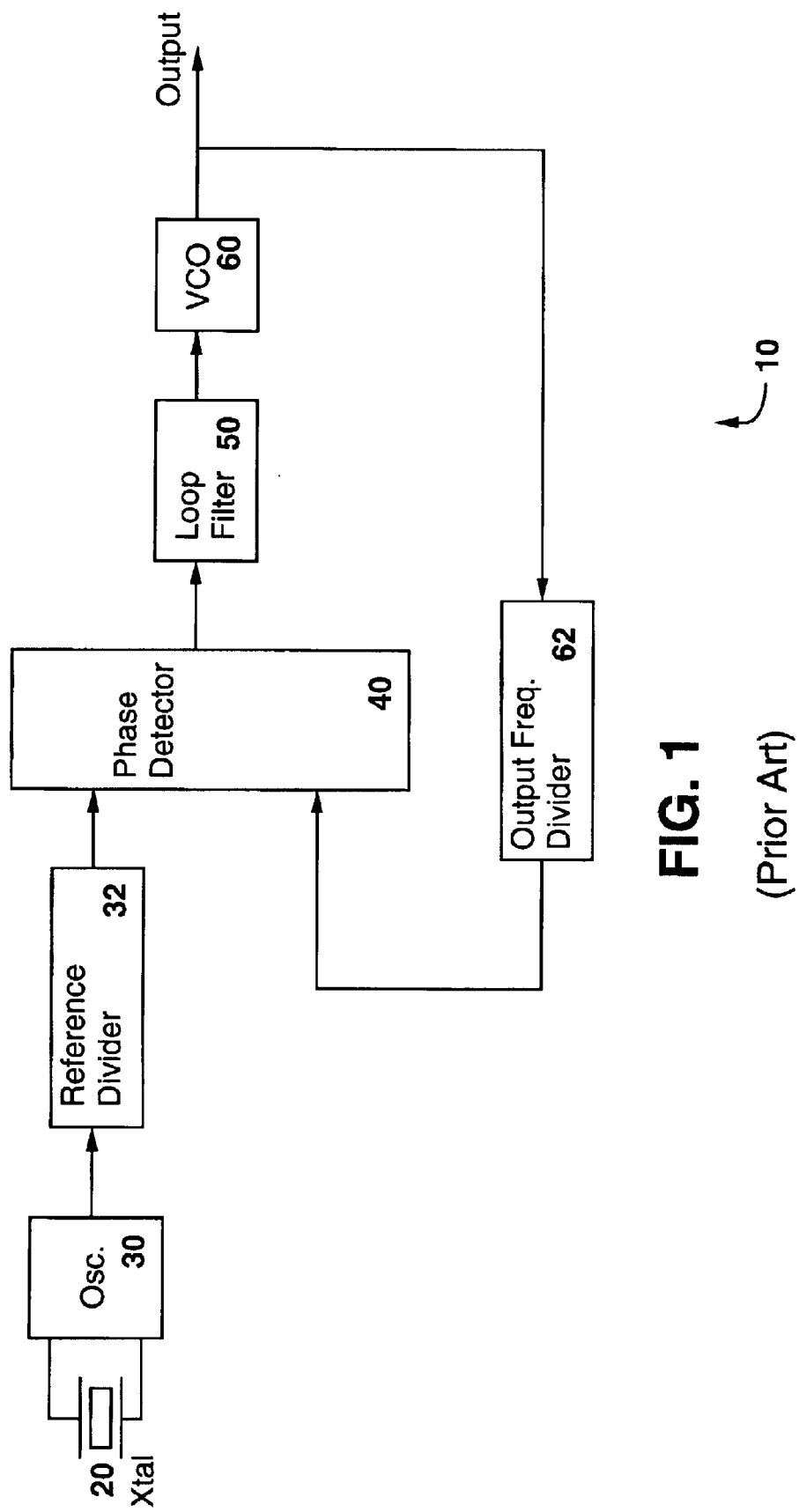
FIG. 1 is a block diagram of a frequency synthesizer.
Figure 2:
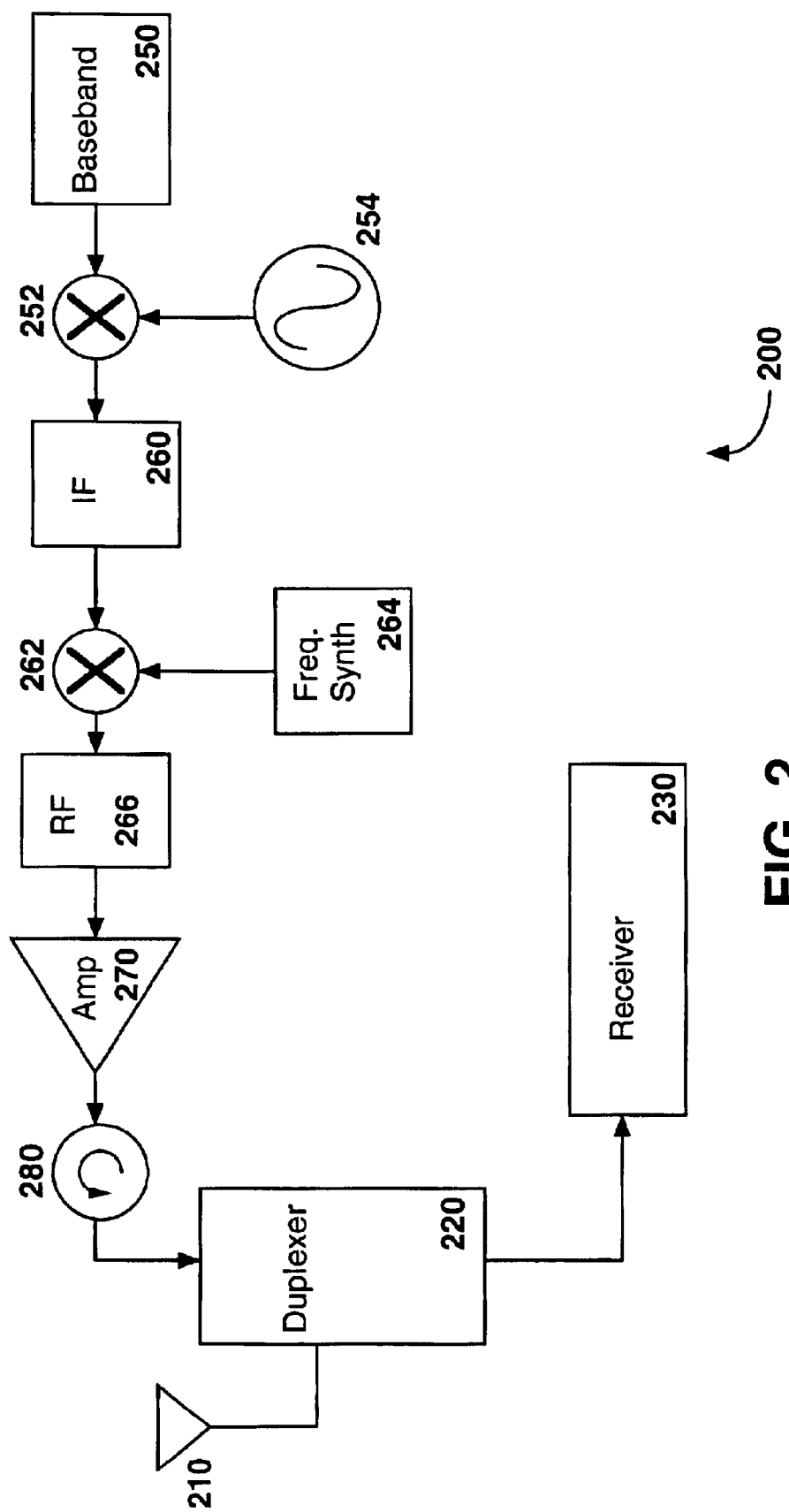
FIG. 2 is a block diagram of a frequency synthesizer in a wireless phone.

As stated above, the wireless phone environment presents one application in which a frequency synthesizer is commonly used. FIG. 2 presents a block diagram of one possible configuration of a wireless phone showing an application of a frequency synthesizer.

The wireless phone 200 is configured to operate over distinctly defined RF channels. One band of RF frequencies is designated the transmit band and a different distinct band of RF frequencies is designated the receive band. The two bands are typically closely spaced but do not overlap. Receive signals are coupled to the wireless phone 200 through the antenna 210. The received signals are coupled from the antenna 210 to a duplexer 220. The duplexer 220 is used to couple receive signals from the antenna 210 to the receiver 230 while simultaneously attenuating energy in the transmit band. Receive signals output from the duplexer 220 are coupled to a receiver 230. The receiver 230 filters, amplifies, downconverts, and processes the received signal. The receiver 230 incorporates user interfaces that enable it to present the received information to the user. The user interface may include an earpiece speaker to provide audio output to the user as well as a display to provide textual or graphical output to the user.

The transmit path of a wireless phone 200 includes a baseband 250 circuit that provides the interface between the phone 200 and the user. The user interface may include a keypad, a touch sensitive screen, and a microphone. The baseband circuit 250 collects and processes the user input. The type of processing includes conditioning the input and modulating the input in the modulation format specified by the phone system. The input signal conditioning may consist of filtering as well as digitizing.

The processed baseband signal is then upconverted to an Intermediate Frequency (IF). Upconversion of the baseband signal is performed using a first mixer 252 in conjunction with a first Local Oscillator (LO) 254. The first LO 254 is typically a fixed LO such that the IF is constant within a predetermined narrow band. A fixed first LO 254 minimizes the complexity required in the IF processing section 260. The IF processing circuit 260 filters and amplifies the upconverted baseband signal. The IF section 260 may include an Automatic Gain Control (AGC) section to ensure that subsequent amplifiers are not compressed. The output of the IF section 260 is coupled to a second mixer 262 that uses the output of a frequency synthesizer 264 to upconvert the IF signal to an RF signal. The frequency synthesizer 264 is capable of tuning in discrete steps over a frequency band to provide upconversion of the IF signal to a specified RF channel.

The upconverted output of the second mixer 262 is coupled to an RF section 266 where the RF signal is filtered and amplified. The RF section 266 filters out the unwanted mixer products as well as filtering out spurious frequency components that degrade the quality of the RF signal. The output of the RF section 266 is coupled to an amplifier 270 that provides the final gain stage for the transmit signal. The output of the amplifier 270 is coupled to an isolator 280. The isolator 280 is used to prevent signal reflections and energy coupled in the transmit frequency band from reaching the transmit circuits of the phone 200. The output of the isolator 280 is coupled to the duplexer 220 which couples the transmit RF signal to the antenna 210.

The use of a common antenna 210 for both the transmit and receive signals is accomplished by using the duplexer 220 to couple the signals to and from the antenna 210. In the receive path the duplexer 220 couples the signal received at the antenna 210 to the receiver 230 while rejecting signals in the transmit frequency band. The signals in the transmit frequency band are rejected in the duplexer 220 path to the receiver to eliminate the possibility of saturating the receiver 230 with transmit power.

The wireless phone 200 powers down a number of circuits when it is placed in the sleep mode to conserve battery power. Portions of the receiver 230 are powered down as well as significant portions of the transmitter. The amp 270, RF section 266, IF section 260, and frequency synthesizer 264 are powered down when the wireless phone 200 is in sleep mode.

However, it is not advantageous to completely power down all circuits because the wireless phone 200 needs to periodically wake up and service overhead tasks required in the communication system. A minimal number of circuits remain powered up to minimize the wake up time required by the wireless phone 200. Maximizing the sleep time maximizes the amount of power that is conserved. Minimizing the wake up time of the phone maximizes the phone sleep time.

Figure 3:
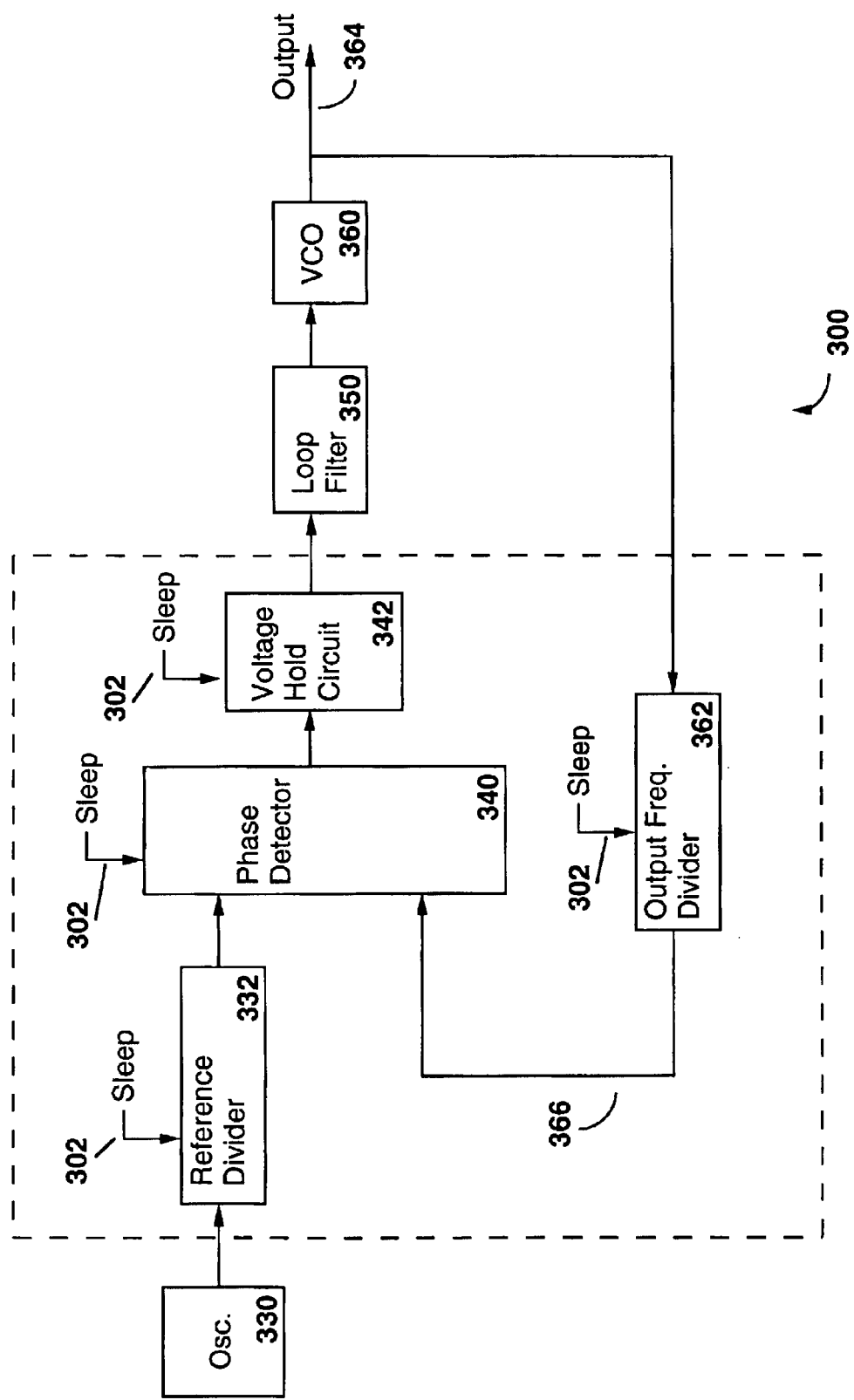
FIG. 3 is a block diagram of a frequency synthesizer that maintains the VCO control voltage in low power modes.

One method of minimizing the wake up time of the phone is to minimize the lock time associated with the frequency synthesizer. An exemplary embodiment that accomplishes this is shown in FIG. 3. FIG. 3 depicts a block diagram of a frequency synthesizer 300 having active and sleep modes. When the frequency synthesizer 300 is placed in the sleep mode the voltage value on the VCO control line 352 is maintained. The frequency synthesizer 300 of the exemplary embodiment operates as a conventional frequency synthesizer when the frequency synthesizer 300 is operated in the active mode.

The reference oscillator 330 produces a stable reference signal. The output of the reference oscillator 330 is coupled to the input of a reference divider 332. The reference divider 332 scales the frequency of the reference oscillator 330. The output of the reference divider 332 is coupled to a first input on the phase detector 340. The reference divider 332 is controlled by a sleep signal 302 which commands the reference divider 332 to power down when the phone is in the sleep mode. When the reference divider 332 is powered down in the sleep mode the value of the divider ratio may be lost. If this is the case the divider ratio will need to be reprogrammed when the reference divider 332 is commanded to wake up. Alternatively, the divider ratio of the reference divider 332 may be hard wired or stored in nonvolatile memory such that loss of power does not result in its loss. The divider ratio of the reference divider 332 may also be stored in a portion of memory that is not powered down when the reference divider 332 is commanded to go into the sleep mode. The choice as to which configuration is most advantageous will depend on the specific frequency synthesizer 300 application.

Reference dividers 332 are typically used in most frequency synthesizers 300 to allow the use of a higher frequency reference oscillator 330 while maintaining a lower frequency at the input to the phase detector 340. A higher frequency reference oscillator 330 permits a more reasonably sized crystal oscillator. However, a lower frequency is desirable at the phase detector 340 input because the frequency of the phase detector 340 determines the tuning step size of the frequency synthesizer 300. The reference divider's 332 inclusion in the frequency synthesizer 300 is not mandatory and one of ordinary skill in the art will recognize that the frequency synthesizer 300 can be implemented without a reference divider 332.

The VCO 360 generates the output signal 364 of the frequency synthesizer 300. The VCO 360 output frequency is determined by the signal applied at the control input of the VCO 360. The VCO 360 output is also coupled to an output frequency divider 362. The output frequency divider 362 scales the frequency of the VCO 360 to the frequency of the phase detector 340. The output frequency divider 362 is advantageous when the frequency synthesizer 300 is required to tune over multiple channels. The frequency synthesizer 300 can also be tuned by varying the reference divider 332 or the reference oscillator 330, however, the most common method is the utilization of the output frequency divider 362.

The output frequency divider 362 is controlled by a sleep signal 302 which commands the output frequency divider 362 to power down when the phone is in the sleep mode. The value of the output divider ratio, analogous to the reference divider ratio, may be lost when the output frequency divider 362 is commanded to go into the sleep mode. However, like the reference divider ratio value, the output frequency divider ratio value can be saved in nonvolatile memory or can be saved in a memory location that is not powered down when the output frequency divider is commanded to go into the sleep mode.

The scaled frequency output 366 of the output frequency divider 362 is coupled to a second input on the phase detector 340. The phase detector 340 compares the two input signals and outputs a signal based on the phase error between the two input signals. The phase detector 340 is controlled by a sleep signal 302 which commands the phase detector 340 to power down when the phone is in the sleep mode.

The output of the phase detector 340 is coupled to the input of a voltage hold circuit 342 that is designed to maintain the VCO 360 control voltage signal when the frequency synthesizer is placed in the sleep mode. The actual implementation of the voltage hold circuit 342 depends on the type of phase detector 340 used in the loop. The voltage hold circuit 342 can be a sample and hold circuit where the output voltage of the phase detector is sampled continuously and held when the sleep signal 302 indicates the frequency synthesizer 300 is placed in the sleep mode. The sleep signal 302 commanding the voltage hold circuit 342 does not cause it to power down in the sleep mode. Instead, the sleep signal 302 commands the voltage hold circuit 342 to change from sampling the voltage on the control line, when the sleep signal 302 indicates an active mode, to maintaining the voltage on the control line when the sleep signal 302 indicates sleep mode.

The output of the voltage hold circuit 342 is coupled to the input of a loop filter 350. The loop filter acts to limit the bandwidth of the VCO 360 control signal. The loop filter 350 is commonly implemented as a passive filter and therefore requires no external power source. However, the loop filter 350 can be implemented as an active filter. The output of the loop filter 350 is coupled to the control input of the VCO 360. As stated above, the output frequency of the VCO 360 is determined by the signal applied at the control input.

When the frequency synthesizer 300 is operating in the active mode all of the elements in the synthesizer are active and the voltage hold circuit 342 allows the output from the phase detector 340 to proceed unchanged to the loop filter 350. The loop operates to lock the VCO 360 output to the reference frequency when the frequency synthesizer 300 is in the active mode. When the frequency synthesizer is commanded to the sleep mode those elements that utilize the sleep signal 302 as a power control signal are powered down. The voltage hold circuit 342 utilizes the sleep signal 302 to maintain the voltage on the VCO 360 control line 352 at the value just prior to the application of the sleep signal 302.

When the frequency synthesizer 300 is commanded to return to the active mode from the sleep mode the VCO 360 initially operates at a frequency much closer to the frequency desired when the loop is locked. Therefore, the initial frequency error in the loop is smaller than if the VCO control voltage were not controlled during the sleep mode. The loop is able to reduce the time it takes to lock the VCO 360 to the reference frequency 330 because of the smaller initial frequency error. The reduction in lock time serves to reduce the time the phone requires to service any idle state overhead tasks. This allows the phone to maximize the sleep time thereby maximizing battery life.

Figure 4:
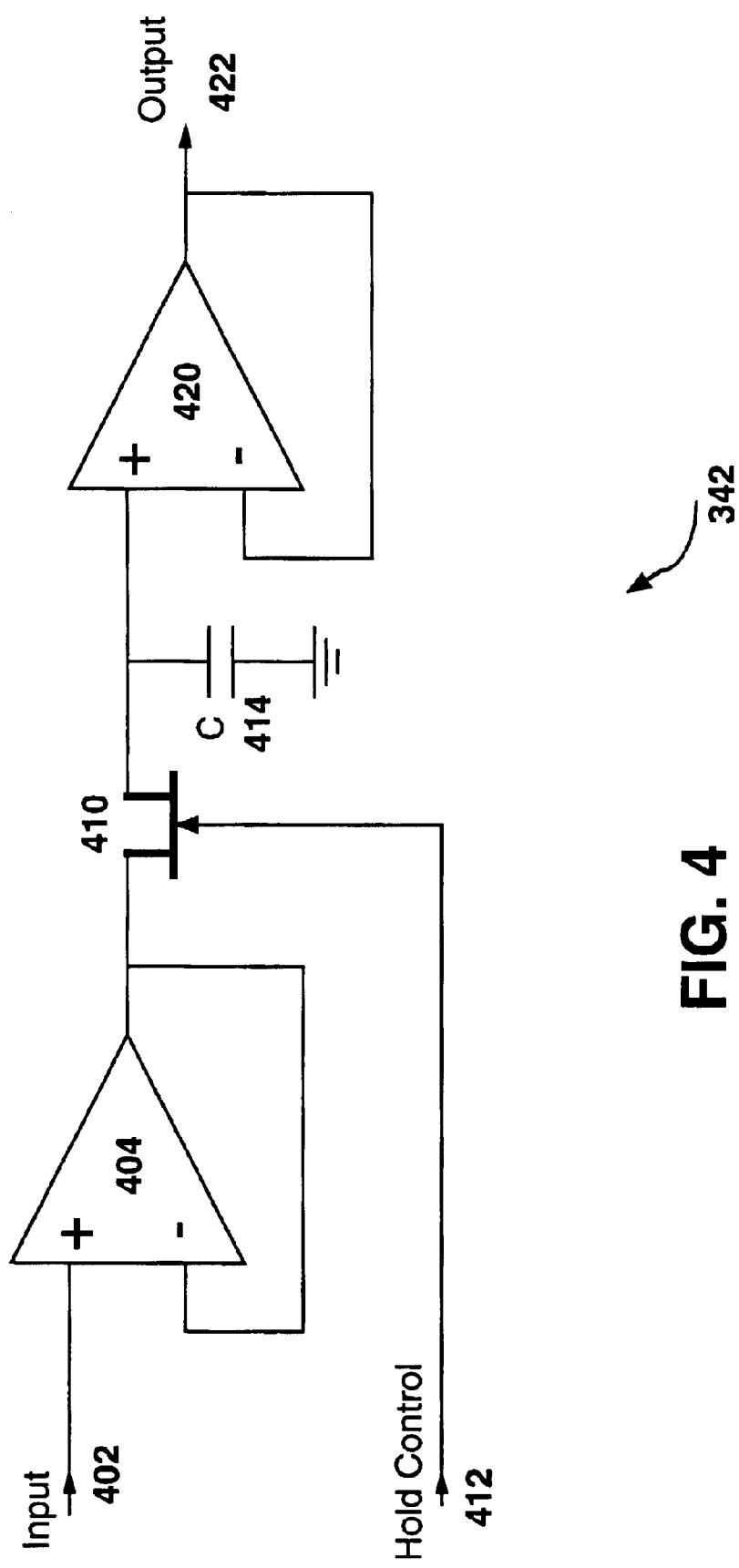
FIG. 4 is a block diagram of a circuit used to maintain the VCO control voltage.

An exemplary configuration of a voltage hold circuit 342 is shown in FIG. 4. The voltage hold circuit 342 incorporates an input 402 for coupling signals to the circuit. Signals from the phase detector 340 output couple to the voltage hold circuit 342 input 402. The input 402 is the non-inverting input to a first amplifier 404 configured as a unity gain buffer. The output of the first amplifier 404 is coupled to the input of a switch 410. The switch 410 is shown as a FET in FIG. 410 but any type of switch with suitable switching characteristics can be used in the application. The output of the switch 410 is coupled to the non-inverting input of a second amplifier 420 configured as a unity gain buffer. Additionally, a capacitor 414 is coupled to the non-inverting input of the second amplifier 420. A first terminal of the capacitor 414 is coupled to the non-inverting input of the second amplifier 420, while the second terminal of the capacitor 414 is coupled to ground. The output of the second amplifier 420 serves as the output 422 of the voltage hold circuit 342. A control line, labeled Hold Control 412 in FIG. 4, is used to control the position of the switch 410. The Hold Control 412 line is controlled by the sleep signal 302 when the circuit of FIG. 4 is used as the voltage hold circuit 342 of FIG. 3.

The voltage hold circuit 342 functions in either a transparent mode or a hold mode. The voltage hold circuit 342 operates in the transparent mode, also known as a sample mode, when the Hold Control 412 line commands the switch 410 to the closed circuit position. The output of the first amplifier 404 is identically the input to the voltage hold circuit 342. The output of the first amplifier 404 is couple to the non-inverting input of the second amplifier 420 when the switch 410 is in the closed position. The capacitor 414 couple to the same non-inverting input to the second amplifier 420 tracks the voltage output of the first amplifier 404. The output of the second amplifier 420, which serves as the output 422 of the voltage hold circuit 342, tracks the voltage on the capacitor 414.

The voltage hold circuit 342 operates in the hold mode when the Hold Control 412 line commands the switch 410 to the open circuit position. The output of the first amplifier 404 is no longer coupled to the input of the second amplifier 420 when the switch 410 is in the open circuit position. Instead, the capacitor 414 serves as the only element that is coupled to the input of the second amplifier 420. However, the capacitor 414 stores the voltage that was across its terminals when the switch 410 was in the closed position. Thus, when the switch 410 is in the open circuit position, the second amplifier 420 outputs the voltage stored in the capacitor 414. The voltage stored in the capacitor 414 represents the last voltage value output from the first amplifier 404 prior to open circuiting the switch 410. The output of the second amplifier 420 is constant in the hold mode since the first amplifier 404 no longer drives the voltage level across the capacitor 414.

The output of the second amplifier 420, which is the output of the voltage hold circuit 342, is coupled to the loop filter 350. The loop filter 350 serves to couple the VCO control voltage to the VCO 360. Therefore, it can be seen that the circuit of FIG. 4 can be used to allow continuous control over the VCO control voltage or can be used to maintain the VCO control voltage at a given level.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A method for reducing the lock time of a Phase Locked Loop (PLL) comprising:

sampling a Voltage Controlled Oscillator (VCO) control voltage of an active PLL;

maintaining the VCO control voltage at the sampled VCO control voltage in response to a command signal, wherein the command signal is a sleep signal, maintaining power to a memory element during a period when the sleep signal is active;

storing a ratio of a reference divider in the memory element when the sleep signal is active; and restoring the ratio to the reference divider from the memory element when the sleep signal is no longer active.

2. The method of claim 1 further comprising planting the PLL in a low power mode.

3. The method of claim 2 wherein the task of placing the PLL in the low power mode occurs in response to the command signal.

4. A frequency synthesizer Integrated Circuit (IC) comprising:
   a control signal output; and
   a voltage hold circuit;
   wherein the voltage hold circuit samples the control signal output when the frequency synthesizer IC is in an active mode and maintains the control signal output when the frequency synthesizer IC is in a low power mode in response to a command signal, wherein:
   the command signal is a sleep signal,
   the frequency synthesizer IC switches from the active mode the low power mode in response to a command signal, wherein the command signal is a sleep signal,
   the frequency synthesizer IC maintains power to a memory element during a period when the sleep signal is active,
   the frequency synthesizer IC stores a ratio of a reference divider in the memory element when the sleep signal is active; and
   the frequency synthesizer IC restores the ratio to the reference divider from the memory element when the sleep signal is no longer active.

5. The frequency synthesizer IC of claim 4 wherein the control signal output is a Voltage Controlled Oscillator (VCO) control signal output.

* * * * *